(12) United States Patent
Nguyen

(10) Patent No.: US 6,451,422 B1
(45) Date of Patent: Sep. 17, 2002

(54) THERMAL INTERFACE MATERIALS

(75) Inventor: My N. Nguyen, Poway, CA (US)

(73) Assignee: Johnson Matthey, Inc., Valley Forge, PA (US)

( * ) Notice: Subject to any disclaimer, the term of this patent is extended or adjusted under 35 U.S.C. 154(b) by 0 days.

(21) Appl. No.: 09/452,483

(22) Filed: Dec. 1, 1999

(51) Int. Cl.$^7$ .................................................. B32B 5/16
(52) U.S. Cl. ...................... 428/323; 428/328; 428/330; 428/411.1; 428/457; 428/467; 428/465; 428/484; 442/336; 442/367; 442/374; 442/375; 106/270; 106/272; 106/638; 106/640; 106/641; 106/660; 252/500; 252/512; 252/514; 252/519.3; 252/519.31; 252/519.33; 252/520.2
(58) Field of Search ............................. 428/411.1, 457, 428/467, 465, 484, 323, 328, 330; 442/336, 367, 374, 375; 106/270, 272, 638, 640–641, 660; 252/500, 512, 514, 519.3, 519.31, 519.33, 520.2

(56) References Cited

U.S. PATENT DOCUMENTS

| | | | |
|---|---|---|---|
| 5,989,459 A | * | 11/1999 | Nguyen et al. ............. 252/503 |
| 6,054,198 A | * | 4/2000 | Bunyan et al. ............ 428/40.5 |
| 6,121,354 A | * | 9/2000 | Chronister .................. 524/262 |

FOREIGN PATENT DOCUMENTS

JP     56026915 A   *   3/1981

OTHER PUBLICATIONS

M. Eaton, "Differential Phase Change Thermal Interface Materials", Technological Horizons May 1998, http://www.ecnmag.com/Edit/tech0598.htm, 9 pages.

* cited by examiner

Primary Examiner—Leszek Kiliman
(74) Attorney, Agent, or Firm—Sandra P. Thompson; Robert D. Fish; Rutan & Tucker, LLP

(57) ABSTRACT

Described is an interface material composition that includes rubber, phase change material and thermally conductive filler.

23 Claims, 1 Drawing Sheet

THERMAL INTERFACE MATERIALS

BACKGROUND OF THE INVENTION

As electronic devices become smaller and operate at higher speed, energy emitted in the form of heat increases dramatically. Thermal interface materials are commonly used in such devices to transfer the excess heat dissipated across physical interfaces. Most common types of thermal interface materials are thermal greases, phase change materials, and elastomer tapes. Thermal greases or phase change materials have lower thermal resistance than elastomer tapes because of the ability to be spread in very thin layers and provide intimate contact between adjacent surfaces. Typical thermal impedance values range between 0.6–1.6° C./cm2/W. However, a serious drawback of these types of materials is that thermal performance deteriorates significantly after power cycling, or after thermal cycling, such as from −65° C. to 150° C., when used in VLSI chips. It has also been found that the interface materials have the tendency to be pumped or squeezed out of these mating surfaces when subjected to tests or in use.

The present invention proves a thermal interface material that is particularly suitable for use as interface material in electronic devices. The improvements over existing materials include: ease of handling, improved reliability and higher thermal conductivity.

SUMMARY OF THE INVENTION

The invention is directed to an interface material composition that comprises a rubber, such as a saturated or unsaturated hydrocarbon rubber, a phase change material, such as paraffin waxes, including malenized paraffin waxes, or polymer waxes, and at least one thermally conductive filler. The thermally conductive filler advantageously comprises particles of materials of high thermal conductivity and, preferably, dispersed in the phase change material.

The hydrocarbon rubber may comprise at least one saturated or unsaturated olefin rubber, an hydroxyl terminated rubber or mixtures thereof. Hydrocarbon rubber may comprise saturated rubber from the group ethylene-propylene, polyethylene/butylene, polyethylene-butylene-styrene, polyethylene-propylene-styrene, and hydrogenated polyisoprene. Unsaturated rubbers may comprise polybutadiene, polyisoprene, polystyrene-butadiene.

The phase change material may comprise a paraffin wax having a melting point in the range of about 20° C. to 100° C. Alternatively, the phase change material may comprise a polymer wax having a melting point in the range 40° C. to 160° C. Paraffin waxes may comprise a mixture of solid hydrocarbons having the general formula $C_nH_{2n+2}$.

Desirable fillers for the composition include silver, aluminum, copper, and alloys thereof; boron nitride, aluminum nitride, silver coated copper, silver coated aluminum, carbon fiber, metal coated carbon fiber, and nickel coated fiber. It is presently preferred to employ a filler comprising at least 20% by weight boron nitride or a filler comprising at least 50% by weight of silver, copper and/or aluminum.

It also contemplated to include a functional organic-metallic coupling agent to facilitate dispersion of the filler and an antioxidant may be added to inhibit oxidation and thermal degradation of the phase change material. It is preferable to include thermally conductive filler particles in the range of about 0.5–25 μm with a maximum particle size of about 100 μm.

Additionally, another aspect of the invention is an interface composition material, as described, on a carrier which may be in the form of a tape.

BRIEF DESCRIPTION OF THE DRAWINGS

The accompanying drawing is a graph illustrating the behavior of self cross linked polymer phase change materials and plots heat capacity vs. heating temperature for Examples 15 and 16. The graph illustrates that heat capacity goes to a minimum when the phase change material melts.

DETAILED DESCRIPTION OF THE INVENTION

Figure 1:
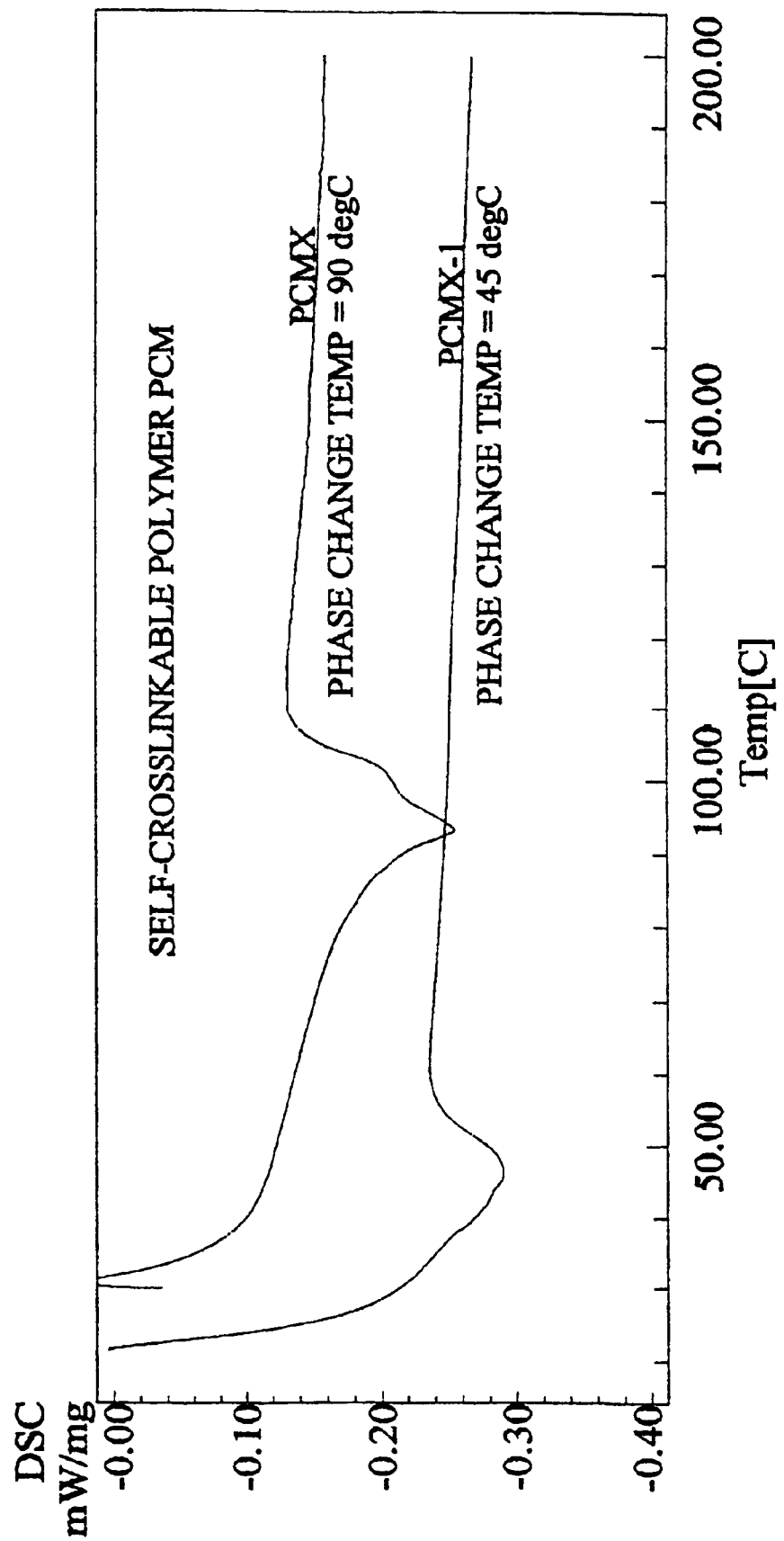

Interface material composition in accordance with the invention comprise a rubber, such as a hydrocarbon rubber, phase change material, such as paraffin waxes or polymer waxes, and at least one thermally conductive filler. The hydrocarbon rubbers are advantageously olefin rubbers, saturated or unsaturated. Saturated rubbers are preferred because they are less sensitive to thermal oxidation degradation. Examples of saturated rubbers that may be used in accordance with the invention are ethylene-propylene rubbers (EPR; EPDM), polyethylene/butylene, polyethylene-butylene-styrene, polyethylene-propylene-styrene, and hydrogenated polyisoprene. Other saturated rubbers are also usable in accordance with the invention. Examples of unsaturated rubbers are polybutadiene, polyisoprene, polystyrene-butadiene, and other unsaturated rubbers may be also used for in accordance with the invention.

Phase change materials comprise paraffin waxes or polymers waxes, or mixtures thereof. Paraffin waxes are a mixture of solid hydrocarbons having a general formula $C_nH_{2n+2}$, having melting points in the range of about 20° C. to 100° C. Polymer waxes are typically polyethylene waxes, polypropylene waxes, and have a range of melting points from about 40° C. to 160° C.

Phase change materials are useful because they store and release heat as they oscillate between solid and liquid form. As a phase change material changes to a solid state it gives off heat. As it returns to a liquid it absorbs heat. The phase change temperature is the melting temperature at which the heat absorption and rejection takes place.

Paraffin-based phase change materials have several drawbacks. They are very fragile and difficult to handle. The also tend to squeeze out of a gap from the device in which they are applied during thermal cycling, very much like grease. The rubber modified paraffin polymer wax system in accordance with the invention avoids these problems and provides significantly improve ease of handling, capability of being produced flexible tape form, and do not pump out or exude under pressure. Although the rubber-wax mixtures have the same phase change temperature, their melt viscosity is much higher and they do not migrate easily. Moreover, the rubber-wax can be designed to be self cross linking which ensures elimination of the "pump out" problem in certain applications.

FIG. 1 is a graph showing the self cross linking polymer phase change material and using differential scanning calorimetry (DSC) charts the heat capacity vs. temperature for Examples 15 and 16 in Table 1 below. As can be seen, heat capacity goes to minimum when the phase change material melts.

Examples of self cross linking rubber-wax systems in accordance with the invention include the following materials:

Rubber—polydiol such as poly (ethylene-butylene) diol, hydroxyl terminated polybutadiene, hydrogenated polyisoprene (diol).

Wax—malenized paraffin wax
polyethylene-maleic anhydride wax
polypropylene-maleic anhydride wax
Polydiol

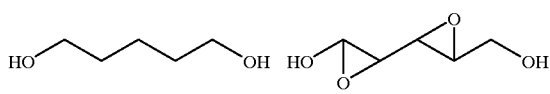

Malenized Wax

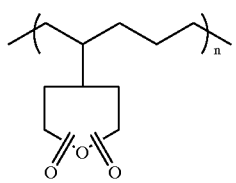

Maleic anhydride group in the wax will react with the hydroxyl group in rubber as follows:

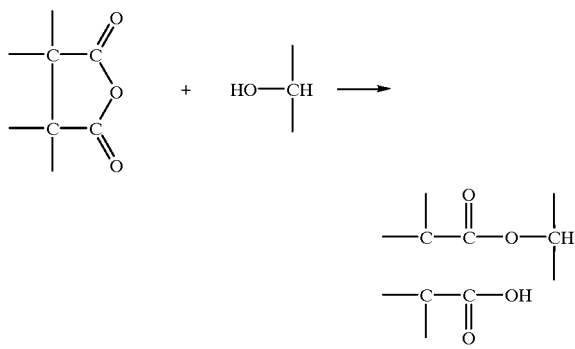

The anhydride functional group can also react with an epoxide to yield as ester linkage. The reaction between the functional rubber/wax mixtures will occur at a temperature about 50 to 150° C. to form a cross linked rubber was network. FIG. 1 illustrates the melting point of rubber polyethylene wax, rubber/paraffin.

Fillers

Thermal filler particles to be dispersed in the phase change mixture should advantageously have a high thermal conductivity. Suitable filler materials include silver, aluminum, copper and alloys thereof; boron nitride, aluminum nitride, silver coated copper, silver coated aluminum, carbon fiber, metal coated carbon fiber such as nickel coated fiber, boron nitride in amounts of at least 20% by weight, and silver, copper or aluminum in amounts of at least 50% by weight are particularly useful. Dispersion of filler particles can be facilitated by addition of functional organic-metallic coupling agents such as organosilane, organotitanate, or organozirconium. Typical filler particle sizes may be in the range of about 0.5–25 um with a maximum of about 100 um. Antioxidants may be added to inhibit oxidation and thermal degradation of the phase change system.

Typical useful antioxidants include Irganox 1076, a phenol type; or Irganox 565, an amine type (at 0.01% to 1%) available from Ciba Geigy.

To illustrate the invention, a number of examples were prepared by mixing the components described in examples 1–16.

The properties of the compositions such as phase change temperature, handling characteristics, and thermal performance were determined.

Processing

To illustrate the invention in the sixteen examples number 1–16, were prepared by blending under vacuum in a high intensity batch mixer at about 110° C. to viscous pastes. Once mixing was completed the pastes were solidified by cooling down to room temperature. The examples are provided in the following table which in addition in describing the composition also indicates the phase change temperature, handling characteristics, thermal and impedance, thermal conductivity and the percentage interfacial delamination after thermal cycling. It is noted that the compositions in accordance with the invention are compared with a control sample designated 1 in Table 1. The description of the commercial designations and the source thereof appears following the table.

TABLE 1

Phase Change Compositions with Thermal Fillers

| | 1 | 2 | 3 | 4 | 5 | 6 | 7 | 8 | 9 |
|---|---|---|---|---|---|---|---|---|---|
| Trilene CP40 | — | 4.9 | 7.35 | 9.8 | 6.5 | 6.5 | 32.7 | 19.6 | 13.2 |
| Astorwax 3040 | 14.7 | 9.8 | 7.35 | 4.9 | 3.2 | 3.2 | 16.4 | 9.8 | 6.5 |
| KRTTS | 0.2 | 0.2 | 0.2 | 0.2 | 0.2 | 0.2 | 0.6 | 0.4 | 0.2 |
| Irganox?76 | 0.1 | 0.1 | 0.1 | 0.1 | 0.1 | 0.1 | 0.3 | 0.2 | 0.1 |
| Aluminum | 85 | 85 | 85 | 85 | — | — | — | — | 75 |
| Ag Flake | — | — | — | — | 90 | — | — | — | — |
| Silver Coated Copper | — | — | — | — | — | 90 | — | — | — |
| Boron Nitride | — | — | — | — | — | — | 50 | — | — |
| Aluminum Nitride | — | — | — | — | — | — | — | 70 | — |
| Carbon Fiber | — | — | — | — | — | — | — | — | 5 |
| Phase Change Temp (° C.) | 45 | 45 | 45 | 45 | 45 | 45 | 45 | 45 | 45 |
| Handling Characteristics | Poor (Brittle) | OK (Less Brittle) | | | | Good (Flexible) | | | |
| Thermal Impedance cm$^{2°\,C./w}$ | 0.45 | 0.40 | 0.30 | 0.25 | 0.40 | 0.45 | 0.60 | 0.51 | 0.56 |
| Thermal Conductivity w.m/° C. | 2.4 | 2.8 | 2.9 | 3.0 | 3.3 | 2.8 | 1.3 | 1.5 | 3.5 |

TABLE 1-continued

Phase Change Compositions with Thermal Fillers

|  | 1 | 2 | 3 | 4 | 5 | 6 | 7 | 8 | 9 |
|---|---|---|---|---|---|---|---|---|---|
| % Interfacial Delamination after Thermal Cycling | 100 | 0 | 0 | 0 | 0 | 0 | 0 | 0 | 0 |

Self Crosslinking Phase Change Compositions with Thermal Fillers

|  | 10 | 11 | 12 | 13 | 14 | 15 | 16 |
|---|---|---|---|---|---|---|---|
| L2203 | 6.4 | 9.5 | 12.6 | 10.5 | 12.6 | 6.3 | 9.6 |
| AC575A | 12.6 | 9.5 | 6.4 | 5.5 | 6.4 | 3.2 | — |
| XWAX | — | — | — | — | — | — | 4.9 |
| KRTTS | 1.0 | 1.0 | 1.0 | 1.0 | 1.0 | 0.5 | 0.5 |
| Aluminum | 75 | 75 | 75 | 83 | 75 | — | 85 |
| Ag Flake | — | — | — | — | — | 90 | — |
| Boron Nitride | 5 | 5 | 5 | — | — | — | — |
| Carbon Fiber | — | — | — | — | 5 | — | — |
| Phase Change Temp (° C.) | 90 | 90 | 90 | 90 | 90 | 90 | 45 |
| Handling Characteristics |  |  |  | Good |  |  |  |
| Thermal Impedance cm$^2$ °C./w | 0.50 | 0.45 | 0.45 | 0.30 | 0.56 | 0.46 | 0.27 |
| Thermal Conductivity w.m/° C. | 2.3 | 2.5 | 2.5 | 2.8 | 3.3 | 2.7 | 2.9 |
| % Interfacial Delamination after Thermal Cycling | 0 | 0 | 0 | 0 | 0 | 0 | 0 |

Definitions

Trilene CP40 - liquid ethylene - propylene rubber supplied by Uniroyal Chemical, Inc. of Middlebury, Connecticut.

Astorwax 3040 - paraffin wax supplied by Allied Signal of Morristown, New Jersey.

AC575A - ethylene-maleic anhydride copolymer supplied by Allied Signal of Morristown, New Jersey.

XWAX - paraffin graff maleic anhydride wax.

L2203 - hydroxyl terminated polyethylene-butylene supplied by Shell Chemical of Houston, Texas.

KRTTS - organotitanate coupling agent supplied by Kenrich of Bayone, New Jersey.

Irganox 1076 - Antioxidant supplied by Ciba Geigy of Hawthorne, NY.

Carbon Fiber - A high graphitized type by best treatment supplied by Applied Sciences of Cedarville, Ohio.

The interface material composition may be applied by stenciling on the desired area of, for example, heatsinks or thermal plates, using a heated screen. It can be also cast into tapes using a tape casting machine. The tapes may be reinforced by a carrier such as a fiber glass aluminum mesh or aluminum foil, copper mesh or foil, and carbon fiber material. A typical thickness range is in the order of about 0.003" to 0.010". To illustrate the application of the interface material composition, the composition of example 4 was cast into a 6 mil tape with two types of carriers, fiber glass mat expanded metals such as silicon, copper, Aluminum, etc. and aluminum mesh. The results are reported in Table 2.

TABLE 2

Thermal Performance of Phase Change Tape

| Carrier Type | Thickness (in) | Thermal Impedance cm$^2$ °C./w |
|---|---|---|
| Al foil | 0.006 | 0.40 |
| Fiberglass | 0.006 | 0.54 |
| None | 0.006 | 0.25 |

As can be seen, the thermal performance of the phase change tape renders it suitable for numerous applications.

It is apparent from the description that various changes and modifications may be made without departing from the scope of the invention.

Accordingly, the scope of the invention should be limited only by the appended claims wherein what is claimed is:

1. A self-crosslinkable interface material composition comprising at least one rubber compound, at least one phase change material and at least one thermally conductive filler.

2. An interface material composition according to claim 1 wherein the phase change material comprises at least one of paraffin wax, polymer wax and malenized paraffin wax.

3. An interface material composition according to claim 1 wherein said rubber comprises at least one saturated rubber, unsaturated rubber or hydroxyl terminated rubber.

4. An interface material composition comprising at least one saturated or unsaturated hydrocarbon rubber, at least one phase change material comprising at least one polymer wax or at least one malenized paraffin wax, and at least one thermally conductive filler.

5. An interface material composition according to claim 4 wherein said hydrocarbon rubber comprises at least one saturated or unsaturated olefin rubber, or mixtures thereof.

6. An interface material composition according to claim 4 wherein said rubber comprises an hydroxyl terminated rubber.

7. An interface material composition according to claim 4 wherein said phase change material comprises paraffin wax having a melting point in the range of about 20° C. to 100° C.

8. An interface material composition according to claim 4 wherein said hydrocarbon rubber comprises saturated rubber from the group ethylene-propylene, polyethylene/butylene, polyethylene-butylene-styrene, polyethylene-propylene styrene, and hydrogenated polyisoprene.

9. An interface material composition according to claim 4 wherein said hydrocarbon rubber comprises unsaturated rubber from the group polybutadiene, polyisoprene, and polystyrene-butadiene.

10. An interface material composition according to claim 4 where said phase change material comprises a malenized paraffin wax.

11. An interface material composition according to claim 4 wherein said paraffin wax comprises a mixture of solid hydrocarbons having the formula $C_nH_{2n+2}$.

12. An interface material composition according to claim 4 wherein said phase change material comprises polymer wax having a melting point in the range of about 40° C. to 160° C.

13. An interface material composition according to claim 4 wherein said polymer wax comprises polyethylene wax or polypropylene wax.

14. An interface material composition according to claim 4 where said filler comprises at least one of silver, aluminum, copper, and alloys thereof; boron nitride, aluminum nitride, silver coated copper, silver coated aluminum carbon fiber, metal coated carbon fiber, and nickel coated fiber.

15. An interface material composition according to claim 14 wherein said filler comprises at least 20 wt. % boron nitride.

16. An interface material composition according to claim 14 wherein said filler comprises at least 50 wt. % of silver coated copper and/or aluminum.

17. An interface material composition according to claim 4 wherein said filler comprises particles in the range of about 0.5 to 25 µm and a maximum particle size of about 100 µm.

18. An interface material composition according to claim 4 further comprising a functional organic-metallic coupling agent to facilitate dispersion of the filler.

19. An interface composition according to claim 18 wherein said functional metallic coupling agent comprises organosilane, organotitanate and/or organozirconium.

20. An interface material composition according to claim 4 further comprising an antioxidant to inhibit oxidation and thermal degradation of the phase change material.

21. An interface material composition according to claim 20 wherein said antioxidant comprises of aromatic amines or phenol groups.

22. An interface comprising at least one rubber, at least one phase change material and at least one thermally conductive material, on a carrier comprising a fiber glass mat, an expanded metal mesh, aluminum foil or mesh, copper foil or mesh or carbon fiber material.

23. An interface according to claim 22 comprising an interface wherein the phase change material comprises at least one of paraffin wax, polymer wax and malenized paraffin wax.

* * * * *